(12) United States Patent
Huda et al.

(10) Patent No.: US 8,085,106 B2
(45) Date of Patent: Dec. 27, 2011

(54) METHOD AND APPARATUS FOR DYNAMIC MODULATION

(76) Inventors: Muzahid Bin Huda, Los Gatos, CA (US); Ho-Yuan Yu, Saratoga, CA (US)

(*) Notice: Subject to any disclaimer, the term of this patent is extended or adjusted under 35 U.S.C. 154(b) by 36 days.

(21) Appl. No.: 12/575,289

(22) Filed: Oct. 7, 2009

(65) Prior Publication Data

US 2010/0090775 A1 Apr. 15, 2010

Related U.S. Application Data

(60) Provisional application No. 61/195,701, filed on Oct. 9, 2008, provisional application No. 61/195,702, filed on Oct. 9, 2008.

(51) Int. Cl.
*H03C 3/06* (2006.01)
*H03K 7/06* (2006.01)

(52) U.S. Cl. .......... 332/123; 332/112; 332/117; 327/36; 375/239

(58) Field of Classification Search .................. 332/109, 332/110, 112, 117, 123, 135; 327/31, 36, 327/164, 172; 375/130, 132, 138, 238, 239
See application file for complete search history.

(56) References Cited

U.S. PATENT DOCUMENTS

| | | | |
|---|---|---|---|
| 4,189,669 A * | 2/1980 | van Loon et al. | 318/811 |
| 4,887,603 A * | 12/1989 | Morawetz et al. | 607/46 |
| 5,025,208 A * | 6/1991 | Danzeisen | 324/76.12 |
| 5,155,455 A * | 10/1992 | Cowley et al. | 332/120 |
| 5,373,387 A * | 12/1994 | Bosch et al. | 398/191 |
| 5,488,627 A | 1/1996 | Hardin et al. | |
| 5,764,697 A * | 6/1998 | Sakuma et al. | 375/239 |
| 5,867,524 A | 2/1999 | Booth et al. | |
| 7,203,079 B2 | 4/2007 | Yang et al. | |
| 7,304,522 B2 | 12/2007 | Kim et al. | |
| 7,391,628 B2 | 6/2008 | Yang et al. | |
| 7,889,054 B2 * | 2/2011 | Hansen | 340/10.1 |

OTHER PUBLICATIONS

Lin et al., Virginia Power Electronics Center VPEC Tenth Annual Power Electronic Seminar, p. 129-136, Sep. 1992.

* cited by examiner

*Primary Examiner* — Robert Pascal
*Assistant Examiner* — Levi Gannon
(74) *Attorney, Agent, or Firm* — Cheng Intellectual Property Group

(57) ABSTRACT

Circuits and methods of dynamic modulation are disclosed. A dynamic modulator is used to reduce measurable conducted and/or radiated electromagnetic interference (EMI). The dynamic modulator is configured to generate either a set of optimal frequency modulation depths or discrete frequencies or both, and dynamically selects them to use over a series of programmable time durations (dwell time). Together with the utilization of Peak, Average or Quasi-Peak (QP) method of measurement, the dynamic modulator can reduce the spectral amplitude of EMI components, in particular the lower harmonics, to effectively pass regulatory requirements. In alternative embodiments, the dynamic modulator is used in a closed loop system to continuously adjust the frequency and the duty cycle of a PWM signal to reduce conducted and/or radiated EMI.

12 Claims, 9 Drawing Sheets

METHOD AND APPARATUS FOR DYNAMIC MODULATION

CROSS-REFERENCE TO RELATED APPLICATIONS

This application claims priority from and incorporate by reference the following U.S. Provisional Applications: "Selection Process and Dynamic Modulation for EMI Reduction", Ser. No. 61/195,701, filed on Oct. 9, 2008; and "PWM Frequency Re-Timing for EMI Control", Ser. No. 61/195,702, filed on Oct. 9, 2008.

BACKGROUND

1. Field of Invention

The present invention relates generally to the fields of both analog and digital circuits for signal modulation. More specifically, the present invention relates to a method and an apparatus for dynamically modulating periodic signal from PWM to reduce measurable radiated and/or conducted electromagnetic interference (EMI).

2. Description of the Related Art

Switch Mode Power Supplies (SMPS) tend to generate EMI due to rapid switching of current and voltage. The spectral components of the EMI emissions typically have peak amplitudes at harmonics of the fundamental frequency of a clock. Accordingly, many regulatory agencies, such as the FCC in the United States, have established testing procedures and maximum allowable emissions for such products. For example, the Commission Electrotechnique Internationale (Comite International Special Des Perturbations Radioelectriques (C.I.S.P.R.)) has guidelines establishing measurement equipment and techniques for determining compliance with regulations. In order to comply with such regulatory limits on EMI emissions, costly suppression measures or extensive shielding may be required. Some techniques used to modify the EMI spectrum have also been proposed, including frequency modulation or frequency hopping. Information relevant to attempts to address these problems can be found in the following publications and U.S. patents: Virginia Power Electronics Center VPED Tenth Annual Power Electronics Seminar, pp. 129-136, Sep. 20-22, 1992 published by Lin et al; U.S. Pat. Nos. 5,488,627 and 5,867,524 issued to Keith B. Hardin et al.; U.S. Pat. Nos. 7,203,079 and 7,391,628 issued to Da-Yung Yang et al.; and U.S. Pat. No. 7,304,522 issued to Jong-hoon Kim et al.

However, each one of these references suffers from one or more of the following disadvantages. An EMI filter causes power consumption and increases the cost and size of the power supply. Frequency modulation alone is not necessarily able to reduce EMI enough to meet the regulation requirements, such as Quasi-Peak measurement. And, although spread spectrum modulation with fixed modulation depth may smear the peak EMI energy out into additional sidebands, it is not adequate to address the difficulties associated with reducing the spectral amplitudes of EMI in lower harmonics, such as the second and third harmonics. For the foregoing reasons, there is a need to reduce radiated and/or conducted EMI without the above problems.

SUMMARY

This invention is directed to a technique that dynamically adjusts and selects optimal frequency modulation depths and/or discrete frequencies in a controlled manner while taking into account Quasi-Peak measurement method to reduce EMI and effectively pass the regulatory requirements.

Various embodiments of circuits and methods of controlled dynamic modulation are disclosed. In one embodiment, a dynamic modulator includes a clock generation circuit for generating clock signal and a frequency modulator for receiving the clock signal and generating a set of frequency modulation parameters associated with the frequency carrier signal. A dynamic timing selector operatively connected to the frequency modulator is configured to set a repetition period and a sequence of programmable time durations, and the sum of all time durations is equal to the repetition period. A frequency modulation parameter selector operatively connected to the frequency modulator is configured to select one of the frequency modulation parameters to use in one of the programmable time durations. The value of the selected frequency modulation parameter is kept within its corresponding time duration. In a variation on this embodiment, the frequency modulation parameters are frequency modulation depths. In a further variation of this embodiment, the frequency modulation parameters are discrete frequencies. In another variation of this embodiment, the frequency modulation parameters include both frequency modulation depths and discrete frequencies.

In a further embodiment, a frequency modulator for modulating a PWM signal to reduce radiated or conducted electromagnetic interference includes a sampling circuit for sampling the period of the PWM signal and an edge detector for detecting edges of the PWM signal. A count buffer includes a plurality of input counters and output counters. The input counters are used to count and store the sampled PWM signal to determine the frequency of the PWM signal. The output counters are used to store and count frequency modulation parameters. An increment/decrement control is connected to the count buffer to update the output buffer in response to an increment/decrement set unit, a rate set unit and a profile set unit. The increment/decrement set unit sets the maximum and minimum frequency deviations of output frequency while rate set unit sets the rate of counting between the maximum and minimum frequency deviations. The profile set unit sets the modulation profile. In a variation of this embodiment, a dynamic control is coupled to the increment/decrement set unit and rate set unit to adjust the rate of updating the output counters.

BRIEF DESCRIPTION OF THE DRAWINGS

These and other features, aspects, and advantages of the present invention will become better understood with regard to the following description, appended claims, and accompanying drawings where:

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principle defined herein may be applied to other embodiments and applications without departing from the spirit and scope of the present invention. Thus, the present invention is not intended to be limited to the embodiments shown, but is to be accorded the widest scope consistent with the principle and features disclosed herein.

EMI can be classified as conducted and radiated EMI. The modulation depth determines the amplitudes of both the carrier (modulated) frequency as well as those of the side bands generated by the frequency modulation.

Figure 1:
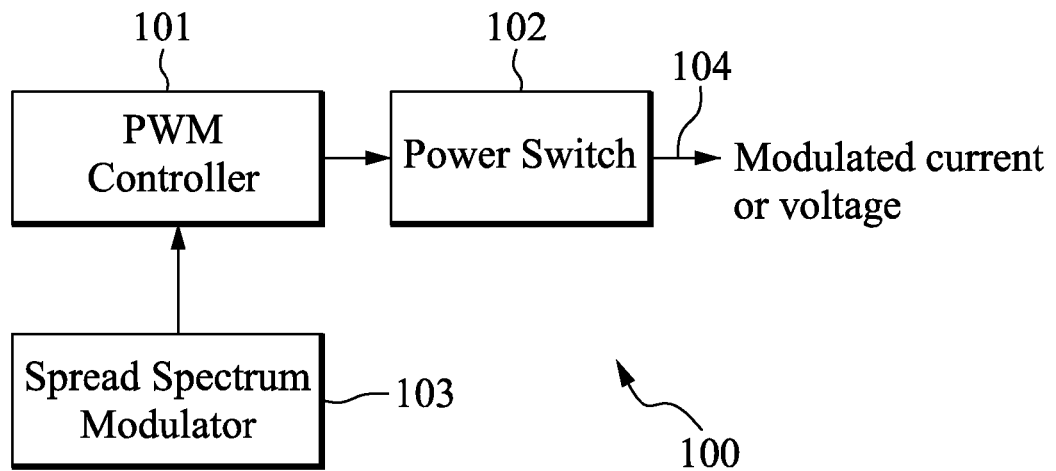
FIG. 1 shows a traditional spread spectrum modulation system for EMI suppression in a Switch Mode Power Supply (SMPS).

FIG. 1 shows a traditional spread spectrum modulation system used to suppress EMI in a Switched Mode Power Supply (SMPS) application. It includes a PWM controller 101 that generates a control signal that switches a power switch 102 such as a MOSFET, Bipolar Junction Transistor (BJT), or other electronic switch. A spread spectrum modulator 103 modulates the frequency of the PWM frequency generated by the PWM controller 101 to control power switch 102. For simplicity, the external control loop and other details of the SMPS are omitted from this drawing. This general scheme can also be used in other applications in which EMI due to a periodic signal must be suppressed. The system has a spread spectrum modulator that varies the switching frequency in either a periodic or random manner The modulation depth is fixed and does not vary over time (static modulation). Using this technique of frequency modulation, the peak EMI energy can be smeared out into additional sidebands.

Figure 2:
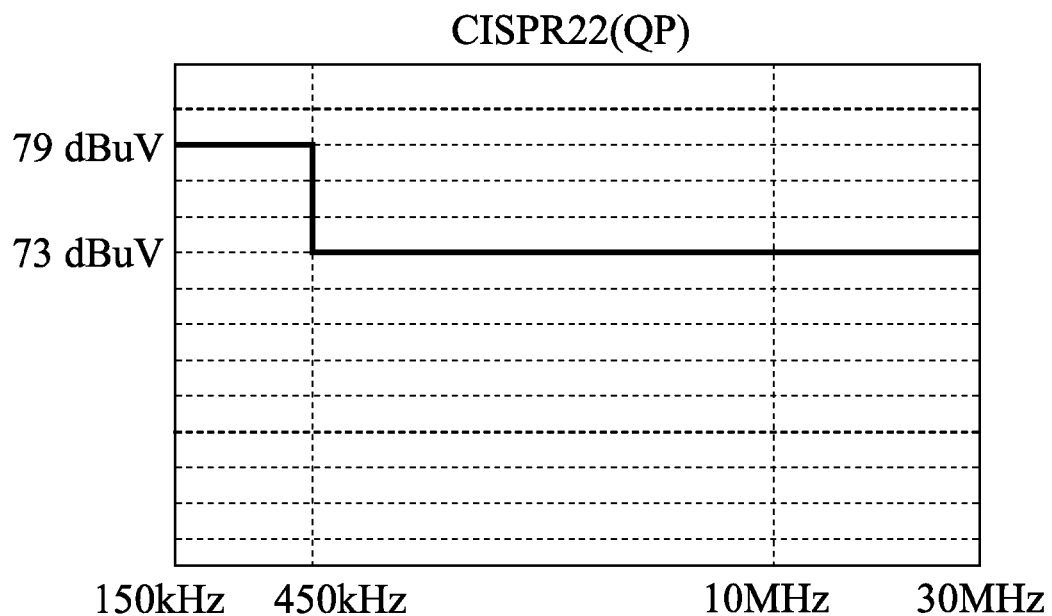
FIG. 2 shows the CISPR22 Quasi-Peak (QP) standard specification for conducted emissions.

FIG. 2 is an example of the CISPR22 Quasi-Peak (QP) standard specification for conducted emissions. The specification limit is 79 dB between 150 KHz to 450 KHz and 73 dB from 450 KHz to 30 MHz. The QP specifications also extend to the radiated frequency band to 1 GHz and beyond.

The mathematical expression for a simple case of sinusoidal frequency modulation applied to a sinusoidal carrier is given below. But this concept also applies to more complex frequency modulation waveforms. The Modulated waveform is written in the following Bessel series form:

$$v = V_C \sin(w_C t + \delta \sin w_m t) =$$
$$J0(\delta) + J1(\delta)\sin(wc +/- wm)t + J2(\delta)\sin(wc +/- 2wm)t +$$
$$J3(\delta)\sin(wc +/- 3wm)t + J4(\delta)\sin(wc +/- 4wm)t +$$
$$J5(\delta)\sin(wc +/- 5wm)t + J6(\delta)\sin(wc +/- 6wm)t +$$
$$J7(\delta)\sin(wc +/- 7wm)t + J8(\delta)\sin(wc +/- 8wm)t + \ldots$$

Where v is the instantaneous amplitude of the modulated waveform, wc is the carrier frequency being modulated and wm is the modulation frequency. $\delta$ is the modulation depth which is the ratio of the frequency deviation to the modulation frequency (or rate).

The coefficients J0, J1, J2, J3 . . . represent sidebands that are a function of modulation depth $\delta$. Their numerical values of these coefficients for a given value of the modulation depth ($\delta$) up to 8 terms are shown in Table 1 below. However, an infinite number of modulation depths ($\delta=\infty$) can be implemented, providing an infinite number of combinations for the carrier and sideband amplitude coefficient J(n), where J(n)=J (0), J(1), J(2) . . . J($\infty$).

It should be noted that the effect of frequency modulation by a complex modulating frequency on a complex carrier frequency results in additional Bessel terms at harmonics of both the modulating frequency and the carrier frequency.

TABLE 1

Sideband amplitude for different values of modulation depth $\delta$.

| | J0($\delta$) | J1($\delta$) | J2($\delta$) | J3($\delta$) | J4($\delta$) | J5($\delta$) | J6($\delta$) | J7($\delta$) | J8($\delta$) | J9($\delta$) |
|---|---|---|---|---|---|---|---|---|---|---|
| $\delta = 0$ | 1 | | | | | | | | | |
| $\delta = 1$ | 0.77 | 0.44 | 0.11 | 0.02 | | | | | | |
| $\delta = 1.5$ | 0.51 | 0.56 | 0.23 | 0.06 | 0.01 | | | | | |
| $\delta = 2$ | 0.22 | 0.58 | 0.35 | 0.13 | 0.03 | | | | | |
| $\delta = 3$ | −0.26 | 0.34 | 0.49 | 0.31 | 0.13 | 0.04 | 0.01 | | | |
| $\delta = 4$ | −0.40 | −0.07 | 0.36 | 0.43 | 0.28 | 0.13 | 0.05 | 0.02 | | |
| $\delta = 5$ | −0.18 | −0.33 | 0.05 | 0.36 | 0.39 | 0.26 | 0.13 | 0.05 | 0.02 | |
| $\delta = 6$ | 0.15 | −0.28 | −0.24 | 0.11 | 0.36 | 0.36 | 0.25 | 0.13 | 0.06 | 0.02 |
| $\delta = 7$ | 0.30 | 0.00 | −0.30 | −0.17 | 0.16 | 0.35 | 0.34 | 0.23 | 0.13 | 0.06 |
| $\delta = 8$ | 0.17 | 0.23 | −0.11 | −0.29 | −0.10 | 0.19 | 0.34 | 0.32 | 0.22 | 0.13 |

An infinite number of modulation depths can be generated, but only ten of them are shown here.

As seen from Table 1, frequency modulation of a carrier with a known value of modulation depth $\delta$ allows sidebands of predictable amplitudes to be generated and this technique has been used for EMI reduction. However, changing or hopping between different values of $\delta$ to achieve even further reduction of EMI in frequency modulation mode is an important aspect of this invention. Such hopping between values of the modulation depth δ is referred to as an embodiment of dynamic modulation.

Since the magnitude of the coefficients J(n) is completely specified for a given value of δ, these values determine the amplitude of the measured EMI field (for the carrier, its harmonics and their sidebands). Thus, if the modulation depth δ is varied (modulated over time) continuously or discontinuously, and in either a periodic, non-periodic or random way, the measured time averaged amplitudes of the sidebands as the value of δ is modulated can be lowered provided the values of δ are properly chosen.

Figure 3:
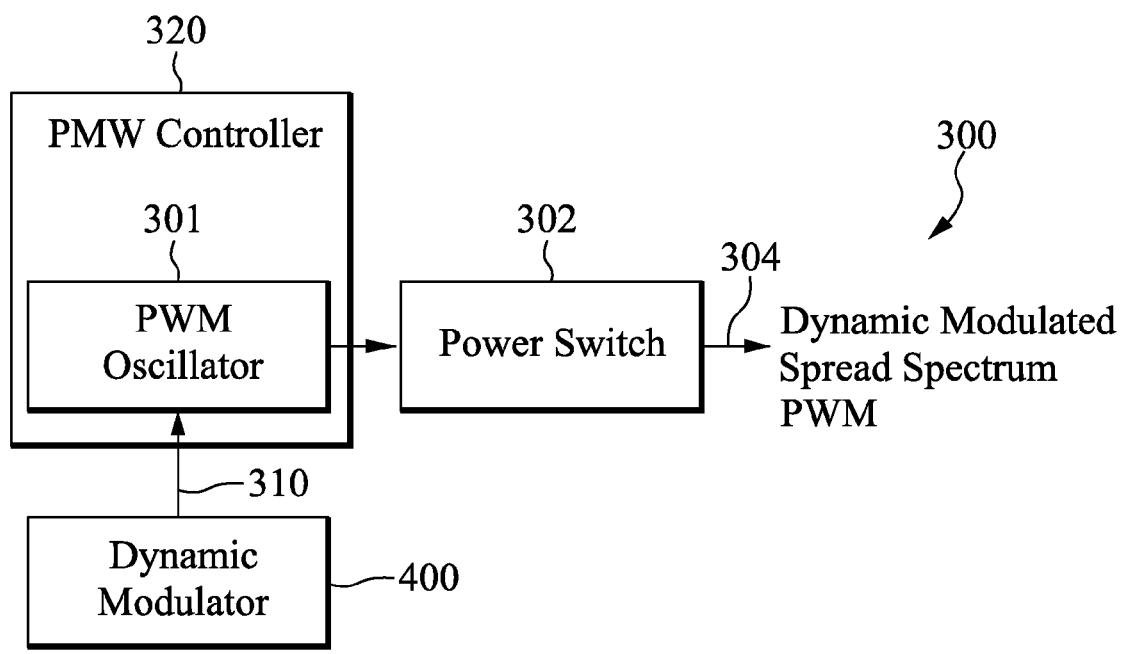
FIG. 3 is a generalized block diagram of a Switch Mode Power Supply (SMPS) using dynamic modulation, in accordance with an embodiment of the present invention.

FIG. 3 is a general block diagram of a Switch Mode Power Supply (SMPS) using the concept of dynamic modulation, in accordance with an embodiment of the present invention. FIG. 3 includes a Pulse Width Modulator (PWM) controller 320 with an oscillator 301, a power switch 302 and a dynamic modulator 400 which is described with more details later with reference to FIG. 4. The output 310 of dynamic modulator 400 is used to modulate signals generated by PWM oscillator 301. The power switch 302 may be a MOSFET, JFET Bipolar Junction Transistor (BJT) or any other type of electronic power switch that handles high currents, voltages and/or power levels. The output 304 of the power switch is a dynamically modulated spread spectrum signal. For purposes of brevity this figure does not show the entire system in which the present invention may be used including systems such as switch mode AC/DC, DC/DC or DC/AC power converter/inverters, switch mode LED drivers, motor control systems, and also high speed clocking systems used in analog, digital or mixed signal systems. The dynamic modulator 400 may be implemented as, but not limited to, an IC (Integrated Circuit), a discrete device, a programmable device or programmable codes running on a computer readable storage medium.

Figure 4:
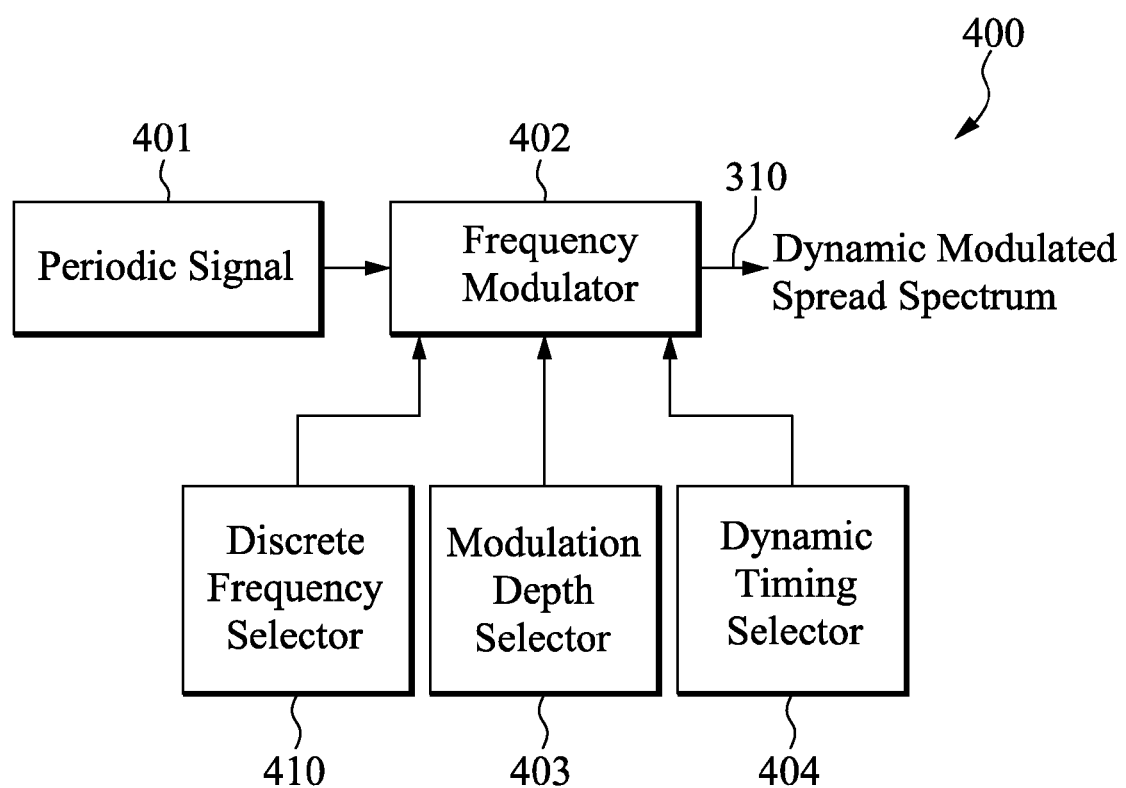
FIG. 4 shows a block diagram of a dynamic modulator, in accordance with an embodiment of the present invention.

FIG. 4 shows a block diagram of a dynamic modulator, in accordance with an embodiment of the present invention. In FIG. 4, a frequency modulator 402 receives periodic signal 401 as input and is coupled to a modulation depth selector 403, a dynamic timing selector 404 and a discrete frequency selector 410. The modulation depth selector 403 and discrete frequency selector 410 can each operate independently or cooperatively. In an alternative embodiment, the dynamic modulator 400 may include only modulation depth selector 403 and dynamic timing selector 404. In yet another alternative embodiment, the dynamic modulator 400 may include only discrete frequency selector 410 and dynamic timing selector 404. Periodic signal 401 which may be from a clock circuit provides the clock to allow each of the components to function properly. The frequency modulator 402 sets the frequency deviation, frequency modulation rate and the path of the frequency variation (modulation profile). The modulation depth selector 403 sets the various modulation depth values (values of δ) between which the frequency modulated signal is alternated. The discrete frequency selector 410 sets various frequencies that the frequency modulated signal hops to. Any number of modulation depth values or frequencies can be set, from 0 to n, where n is a positive number. The dynamic timing selector 404 sets the time duration over which the frequency modulated signal remains at each selected value of modulation depth δ and/or frequency. This duration is also known as the dwell time. The dwell time can be set to any length of time, including the same value for all depths, or to a different length of time for each value of δ and/or frequency.

Figure 5A:
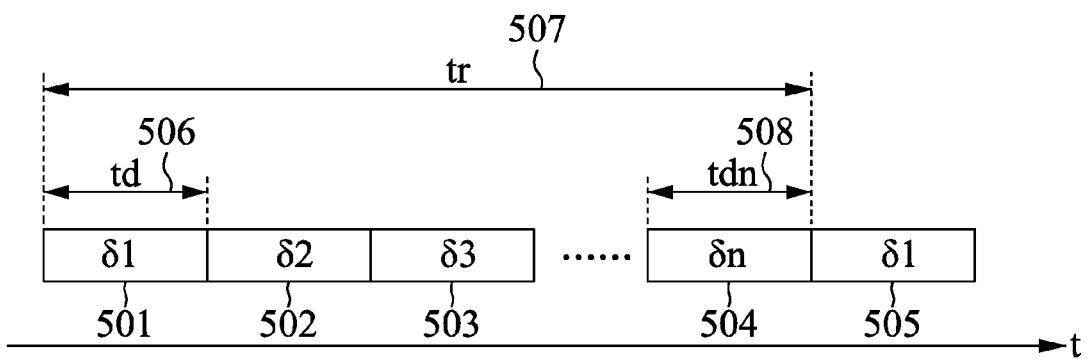
FIG. 5A illustrates the timing of a dynamic modulator operating with modulation depth control, a first embodiment of dynamic modulation, in accordance with the present invention.

Now refer to FIG. 5A which illustrates the timing of a dynamic modulator with modulation depth control only, a first embodiment of dynamic modulator, in accordance with the present invention. The switching signal is frequency modulated at modulation depths $\delta 1, \delta 2, \delta 3, \ldots, \delta n$ over time which are set by modulator depth selector 403. The time duration (dwell time), set by dynamic timing selector 404, over which the modulated frequency remains at each value of δ determines the resulting time averaged amplitudes of the carrier frequency, its harmonics and their sidebands. 501, 502, 503, 504 and 505 represent the spread spectrum modulation depth values of $\delta 1, \delta 2, \delta 3, \ldots, \delta n$ and $\delta 1$ that are impressed on the switching frequency. The parameters td 506 and tr 507 are the dwell time and repetition period respectively. Parameter td 506 represents the time duration over which modulation depth δ1 is impressed on the switching frequency to effect spread spectrum modulation. Also, tdn 508 represents a general duration of the dwell time during which a modulation depth of value δn 504 is impressed. The dwell time at all modulation depths $\delta 1, \delta 2, \delta 3, \ldots, \delta n$ may be constant (i.e. it is the same for all modulation depths), or it may be different (varied) for each modulation depth that is impressed on the signal. These modulation depth values are periodically, non-periodically or randomly repeated at a selected interval tr 507. When these modulation depths are repeated periodically, tr 507 is then the modulation depth repetition period (dynamic modulation period). In this figure the sequence of modulation depth values $\delta 1, \delta 2, \delta 3, \ldots, \delta n$ are shown to be repeated periodically rate with a dynamic modulation period of tr 507. This figure also shows that the sequence of modulation depth values being repeated after each period starts with modulation depth δ1 505. The optimal modulation depth values (δ1 to δn) selected from Table 1 depend on systems and applications for achieving best EMI suppression. This embodiment of modulation depth control is effective for most standard detection methodologies, such as peak detection or Quasi-Peak (QP) detection. When Quasi-Peak detection method is used, the selection criteria of dwell time (td) and repetition period (tr) are similar to that of discrete frequency control which is described later with reference to FIG. 5B. If other detection methods are used, the selection criteria of dwell time (td) and repetition period (tr) will depend on systems and applications.

Figure 6:
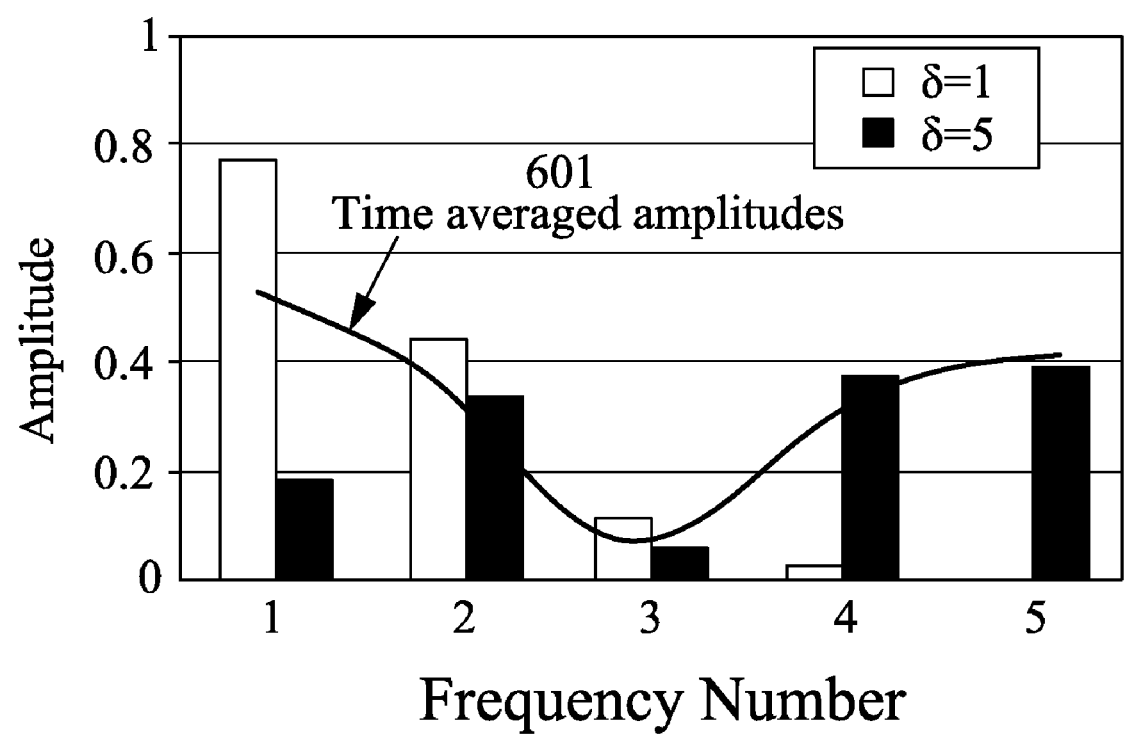
FIG. 6 is a graph illustrating the carrier and sideband amplitudes for two modulation depths, in accordance with an embodiment of the present invention.

FIG. 6 is a graph illustrating the carrier and sideband amplitudes for two modulation depths, in accordance with an embodiment of the present invention. It shows the effect of the present invention of dynamic modulation on the conducted or radiated emissions. In this figure, the system is hopping between two pre-selected modulation depths δ=1 and δ=5. The result is a time averaging of the peak amplitude of the center (carrier) PWM frequency as well as that of all the side bands. The carrier frequency is indicated by frequency number 1, and sidebands 1-4 are indicated by frequency number 2-5 respectively in this figure. In other words, frequency number 2 is the first sideband, and frequency number 3 is the second sideband, and so on. The amplitudes of the carrier frequency and four sidebands are shown for the two values of δ. FIG. 6 illustrates that this invention of dynamic modulation results in averaged amplitudes (peak values) of the carrier frequency and the first sideband to be even further suppressed than is possible with a fixed modulation depth of δ=1 is impressed. For brevity, the sixth, seventh and eighth modulation sidebands that occur for a modulation depth of 5 are not shown in this figure. The resulting time averaged amplitude at each frequency due to dynamic modulation between δ=1 and δ=5 is indicated by the black line 601.

Figure 5B:
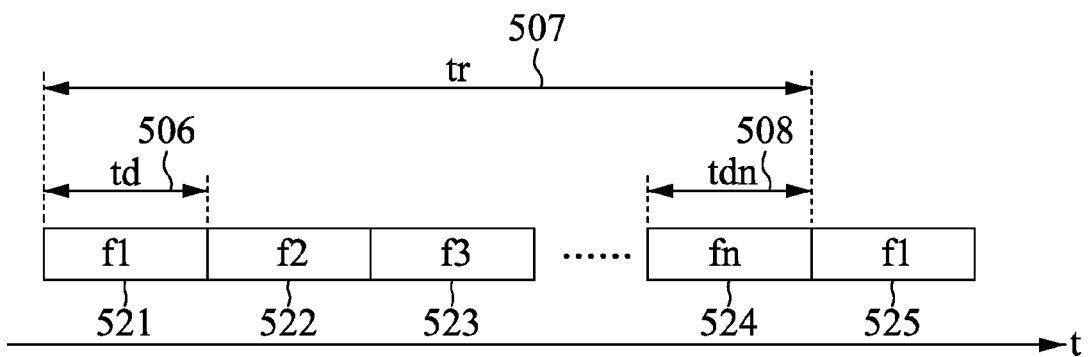
FIG. 5B illustrates the timing of a dynamic modulator operating with discrete frequency hopping control, a second embodiment of dynamic modulation, in accordance with the present invention.

Turning to FIG. 5B which illustrates the timing of a dynamic modulator with discrete frequency hopping control, a second embodiment of dynamic modulator, in accordance with the present invention. It shows the concept of discrete frequency variation (hopping) for conducted and radiated emissions compliance when standard Quasi Peak (QP) detection methodologies for radiated and/or conducted EMI measurement are used. The switching frequency is shifted over a range of values f1, f2, f3, . . . , fn as represented by 521, 522, 523, 524 and 525. 506 represents the dwell time (td) at each value of the frequency and 507 represents the repetition period (tr) at each of the frequencies selected for hopping. The dwell time 506 may be set to be equal for all frequencies f1-fn, and f1 (i.e. 521-525), or it may be set to be varied for each frequency value 521-525. This idea is shown as the parameter tdn 508, where tdn is the dwell time at the nth frequency fn. The dwell time tdn 508 may or may not be equal to td 506. The PWM frequency is shifted at optimal pre-set intervals over a wide range of frequencies. A frequency interval is the difference between any two consecutive frequencies in sequence (e.g. $f_{n-1}$ and $f_n$) and the optimal intervals are preferably set to be any values substantially greater than the resolution bandwidth specified for standard QP measurement methodologies. The dwell time 506 is preferably selected to be substantially shorter than the rise or attack time of the QP detector, and thus enable the strength of the conducted and/or radiated emissions to be lowered to a level than maximum level allowed by standard QP measurement methodologies. The repetition period tr 507 is preferably selected to be substantially longer than the decay time of the QP detector in order to avoid signal strength accumulation at each frequency ensuring that the strength of the conducted and/or radiated emissions remains lower than the maximum allowed limit. The selected frequency values may be periodically, non-periodically or randomly repeated over a selected interval tr 507. In this figure the sequence of frequencies f1-fn (i.e. 521-524) are shown to be repeated periodically with a repetition period of tr 507. This figure also shows that the sequence of frequencies being repeated after each period starts with frequency f1 525. When other detection methods other than Quasi-Peak detection method are used, the frequency intervals and the selection criteria of dwell time (td) and repetition period (tr) will depend on systems and applications.

Figure 5C:
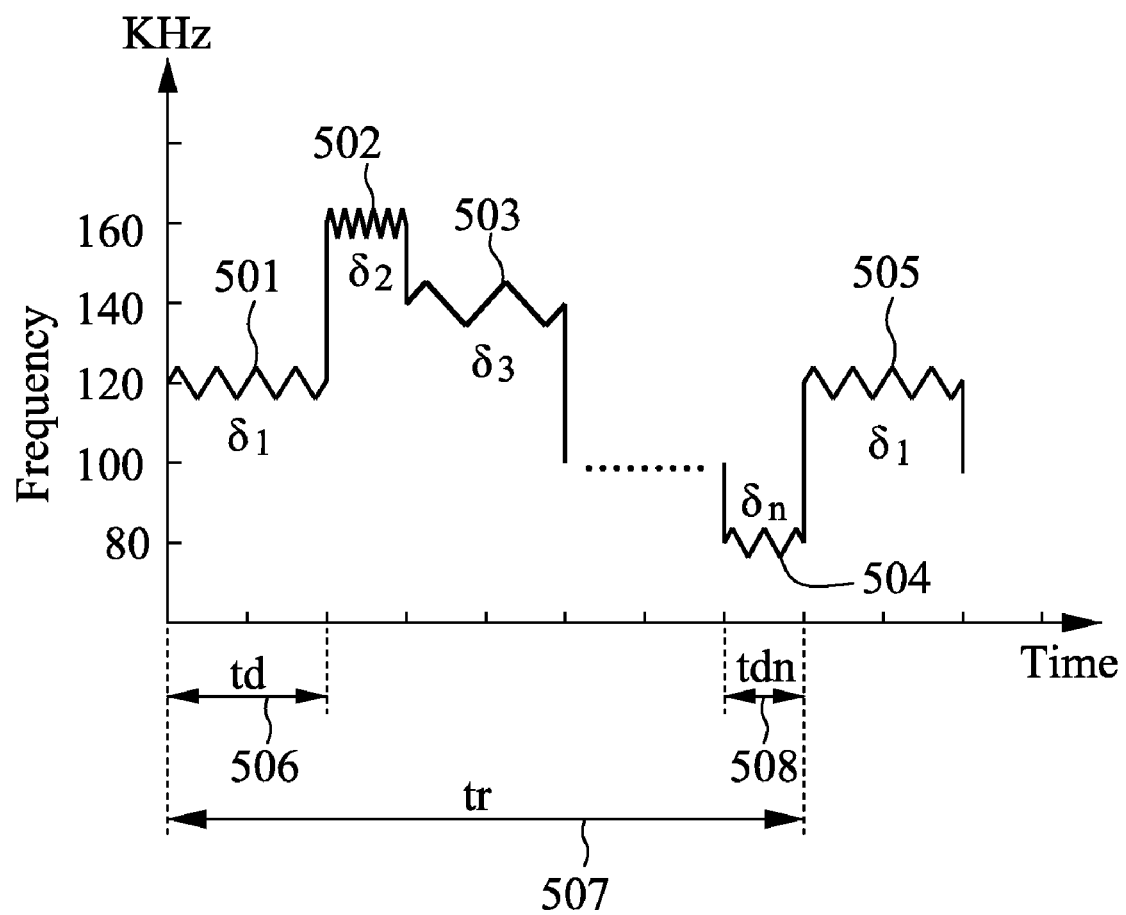
FIG. 5C illustrates the timing of a dynamic modulator operating with modulation depth control superimposed on discrete frequency hopping control, a third embodiment of dynamic modulation, in accordance with the present invention.

As mentioned earlier, the discrete frequency hopping of dynamic modulator can operate independently or with modulation depth changes (or control). FIG. 5C illustrates the timing of this combined control, a third embodiment of dynamic modulation. In FIG. 5C, the vertical axis is frequency and horizontal axis is time. The values and scale of frequency and time are for illustration only. During the first time interval td 506 (or dwell time), frequency f1 is set to 120 kHz and modulation depth δ1 501 is also applied. In the next time interval, frequency is shifted to 160 kHz while modulation depth δ2 502 is used. At the nth time interval tdn 508, the frequency fn is set to 80 kHz with modulation depth δn 504. Also, tdn 508 represents a general duration of the dwell time, and td 506 may or may not be equal to tdn 508. Note that the values of modulation depths (δ1 to δn) used in discrete frequency hopping control may be the same or different, periodically, non-periodically or randomly. They are used to further suppress EMI in particular frequencies when necessary. In this figure, the sequence of both frequencies and modulation depths are shown to be repeated periodically with repetition period tr 507. In alternative embodiments, frequency modulations (fixed modulation depth) may be used in discrete frequency hopping control. The criteria of setting dwell time tdn 508, repetition period tr 507 and frequency intervals of discrete frequency hopping control in FIG. 5B can also be applied here. Note that this technique may be used for any arbitrary periodic frequency, although a frequency range of 80 kHz to 160 kHz is shown in FIG. 5C.

Figure 7:
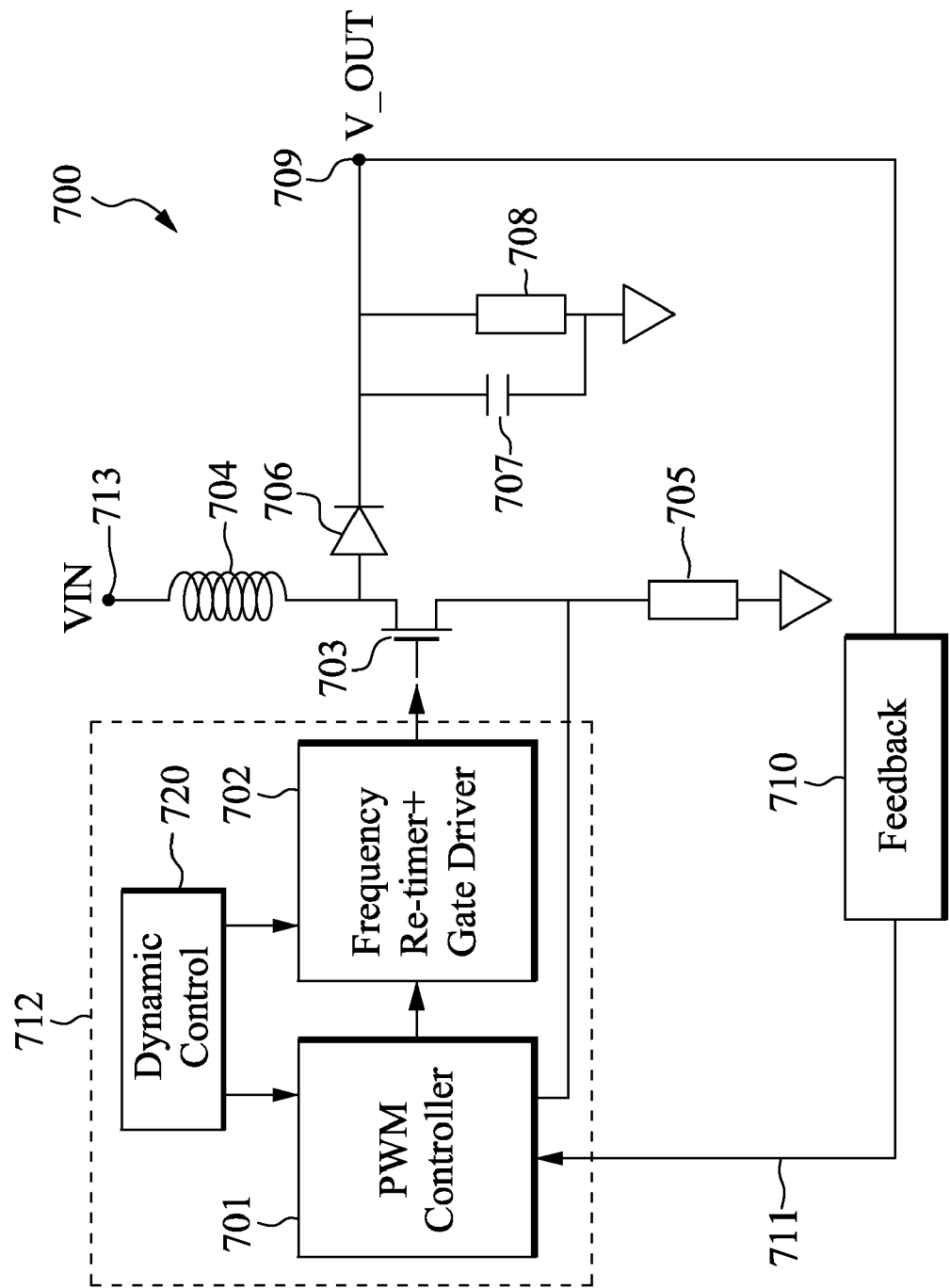
FIG. 7 shows a circuit of PWM voltage regulator, in accordance with an embodiment of the present invention.

FIG. 7 shows a circuit of a dynamic modulator used in a closed loop of a PWM voltage regulator application 700. The function of modulation is achieved by both frequency re-timer 702 and dynamic control 720 together. In this figure, frequency re-timer is combined together with a gate driver circuit as a unit 702 in one possible embodiment of a Switch Mode Power Supply (SMPS). Block 702 drives the gate circuit of the power MOSFET or JFET 703, or it may also drive the base circuit of a bipolar junction transistor (BJT) or other power device. In alternative embodiments, the frequency re-timer block and the gate driver circuit may be separate units. They may also be incorporated or integrated with a Pulse Width Modulator (PWM) circuit 701 and dynamic control 720 into a single integrated block 712.

The PWM Controller 701 generates a fixed frequency PWM signal to maintain a regulated or controlled output at V_OUT 709. The regulated or controlled output V_OUT maybe an electrical parameter such as voltage, current, or power, or it maybe a derivative of these electrical parameters such as mechanical speed, torque or power such as in an electric motor, or it may be light generated from an electro-optic system such as an LED lighting system or other light source. Although FIG. 7 shows a common closed loop configuration used in DC voltage regulation, known as a boost regulator, this invention can be applied to any other closed loop configuration in the applications stated. VIN 713 is the input power source. The regulated parameter V_OUT 709 is fed back to the PWM Controller 701 via the feedback block 710 as a modified signal 711. The frequency re-timer 702 continuously adjusts the frequency of the PWM signal from the PWM Controller 701. Thus, the frequency of the signal applied to the gate of the power switch 703 is continuously (or periodically) varied in a controlled manner. The switch 703 switches at the varying frequency, allowing power from VIN 713 to be delivered at varying rates to the output V_OUT 709. Dynamic control 720 can further adjust the re-timed frequency generated by the frequency re-timer 702. As the frequency re-timer 702 varies the PWM frequency at the gate driver, it also causes corresponding instantaneous variations of the duty cycle of the PWM signal. The system loop comprising 709, 710 and 711 detects variations in the output due to the instantaneous variations of the PWM frequency and provides an error signal to the PWM controller 701 that adjusts or corrects the duty cycle to maintain regulation of V_OUT 709.

There are two modes of operation for frequency re-timer 702. In the first mode of operation, only the period of the input PWM signal from the PWM controller is sampled (counted) to modify the frequency of PWM signal. In the second mode of operation, the ON-time (pulse width or high time) of the PWM signal from 701 is sampled and counted by 702 in addition to the period of the PWM signal to modify not only the frequency (time period) but also to maintain the same duty ratio as currently exists in the PWM signal at the output of 701. From now on, ON-time, pulse width and high time are used interchangeably.

When frequency re-timer 702 is operating in the first mode, the counted period is then incremented and decremented alternately at a set rate and with a pre-determined modulation profile. The maximum count increment and minimum count decrement values, the rate at which the period is incremented and decremented as well as the profile of the variation of the period count, together determine the frequency modulation characteristics. The ON-time that determined the duty cycle of the input PWM signal is not measured, and hence the duty cycle of the re-timed output PWM signal at the gate of switch 703 is neither counted nor adjusted by the frequency retiming circuit 702. Thus, the output at V_OUT 709 varies instantaneously. The PWM 701 brings the output back into regulation when it receives the error signal via the feedback loop comprising 709, 710 and 711.

When operating in the second mode, the frequency re-timer 702 does not directly depend upon the system feedback loop comprising 709, 710 and 711 to adjust the duty cycle as the frequency is re-timed. However, the PWM controller 701 may still use the feedback loop as the primary mechanism to maintain overall regulation and system stability. This mode of operation provides a way to override the input PWM signal from the PWM controller 701. Such additional control allows a plurality of control functions including modification of the switching waveform to a pre-determined or desired profile for controlling output voltage, output current, rpm and torque in electrical motors, light intensity in LED or other lighting technologies using switching voltages or current, and power conversion circuit.

Figure 8:
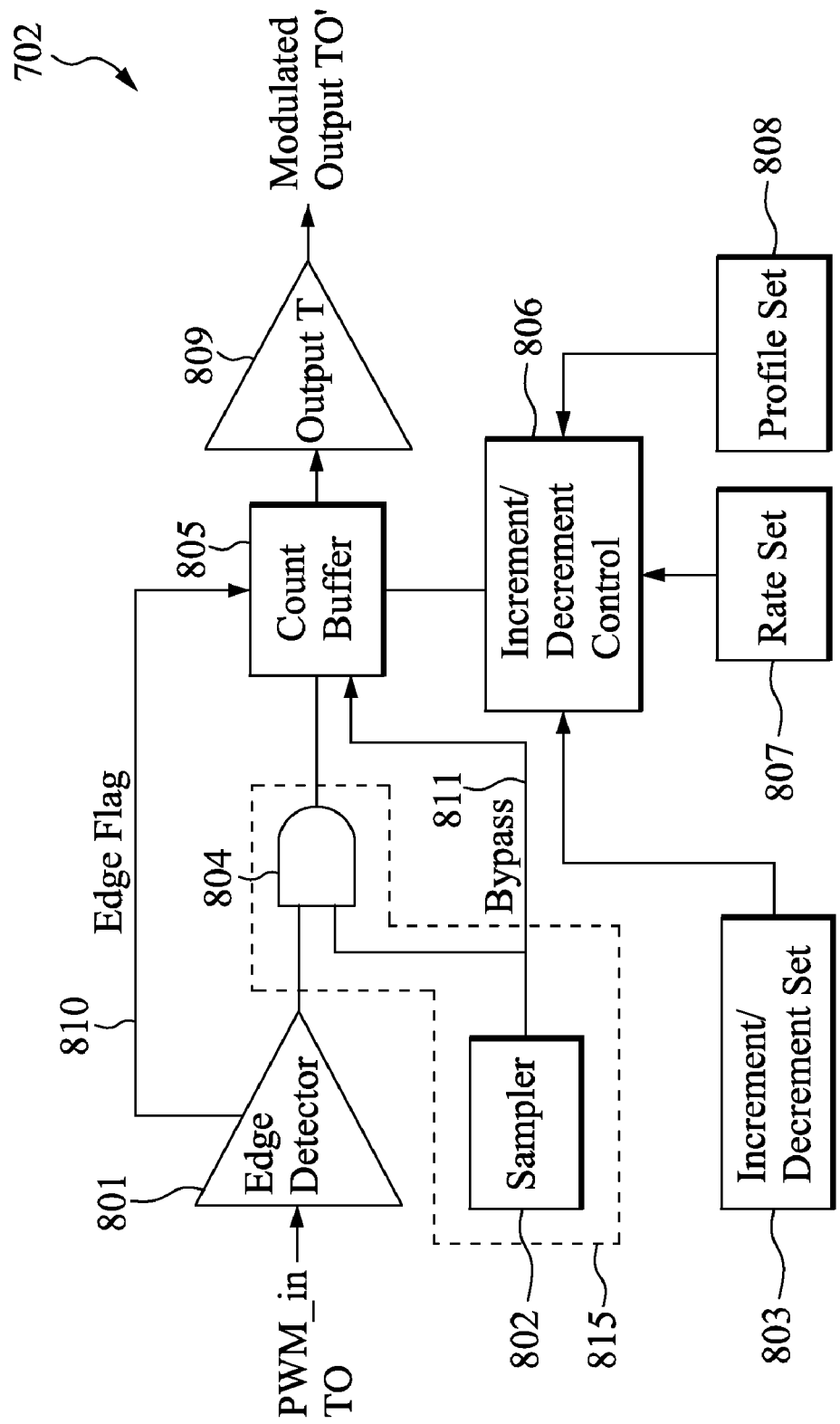
FIG. 8 shows a circuit of frequency re-timer of FIG. 7, in accordance with an embodiment of the present invention.

FIG. 8 shows a circuit of frequency re-timer 702 of FIG. 7, in accordance with an embodiment of the present invention. In this figure, the input portion of this circuit includes an edge detector 801 and a sampling circuit 815 which contains both a sampler 802 and an AND gate 804. The sampling circuit 815 samples the incoming fixed frequency PWM signal. The sampling rate is set to a value that is a multiple of the input PWM frequency. The output of the sampling circuit 815 is a series of discrete pulses that can be counted to determine the width of the PWM pulse. The edge detector 801 can be set to signal an edge flag 810 each time it detects a a) rising edge, b) a falling edge or c) both rising and falling edges of the input PWM signal.

A count buffer 805 including counters, registers and comparators is utilized to store information for determining the characteristics of input PWM signal and works with increment/decrement control 806 to trigger output modulation. The edge flag signal 810 which is an output from the edge detector 801 is used by the count buffer 805 to count one or more of the following: a) the time period of the input PWM signal, b) the ON-time of the input PWM signal and c) the OFF-time (low time) of the input PWM signal. The count buffer 805 uses one or more of the edge flag 810 signals and the two outputs of the sampling circuit 815, which are the output of AND gate 804 and bypass signal 811, to generate a count that represents the PWM signal received at the input of 801.

The frequency modulation portion of this circuit includes a increment/decrement set 803, increment/decrement control 806, rate set 807 and profile set 808 blocks. The increment/decrement control 806 sets the maximum and minimum count values that the count buffer 805 counts to as the frequency deviation. The rate set 807 sets the rate at which the value in the count 805 is counted between the minimum and maximum values, and the profile set 808 selects the path (profile) over which the count rate varies with time. The frequency modulated output from the output circuit 809 is a time varying version of the input PWM signal. To perform dynamic modulation, dynamic control 720 of FIG. 7 will further enable increment/decrement control 806 and rate set 807 to update and change the rate of updates of corresponding counters in count buffer 805.

The sampler 802 updates the count in the count buffer 805 during every period of the incoming PWM signal. This count is used to detect changes in frequency of the input PWM signal. If a change in the incoming PWM frequency occurs, the count buffer 805 finishes the current frequency modulation (increment/decrement) cycle before starting a fresh frequency modulation cycle on the input PWM frequency with the new count value.

Figure 9:
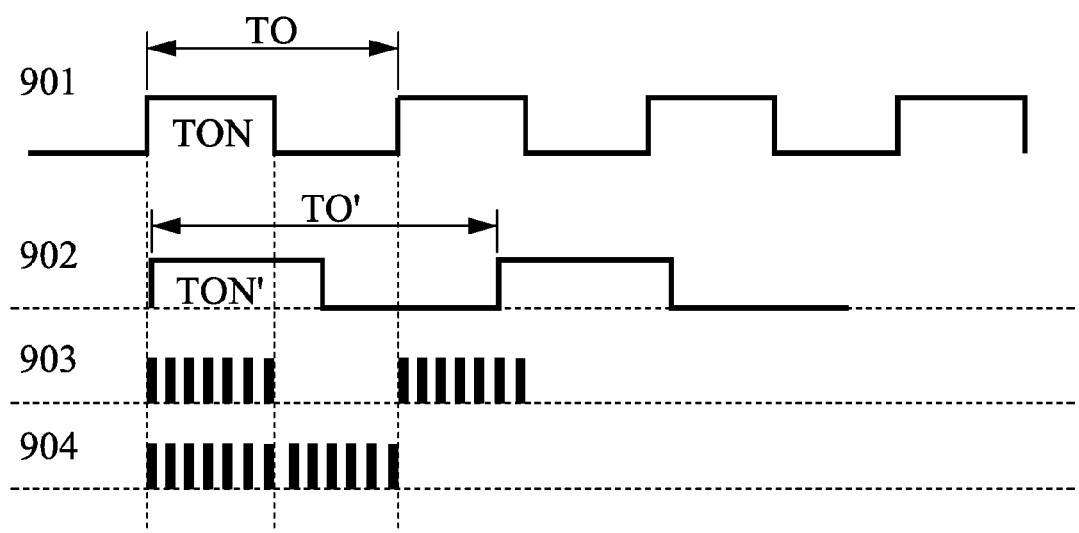
FIG. 9 illustrates the timing of input and output signals of frequency re-timer, in accordance with an embodiment of the present invention.

FIG. 9 illustrates the timing of input and output signals of frequency re-timer 702 of FIG. 7, in accordance with an embodiment of the present invention. Waveform 901 shows the input PWM signal. TON is the ON-time of the PWM signal and TO is its time period. Waveform 902 shows the re-timed waveform at the output of frequency re-timer 702. The frequency (or time period) of 902 is continuously varied according to the preset values from rate set 807 and profile set 808 described in FIG. 8. Waveform 903 shows the output of AND gate 804 in FIG. 8. This waveform provides the discrete, sampled version of the ON-time of the input PWM signal. Waveform 903 is used in the second mode of operation, duty ratio maintenance, mentioned earlier with reference to FIG. 7. Waveform 904 shows the bypass signal 811 of the sampler 802 in FIG. 8 and provides the count of the period of the input PWM signal. That is, waveform 904 is the sampled version of the time period TO of 901. Waveform 904 is used to count the total time period (hence frequency) of the input signal and is stored in count buffer 805 in FIG. 8.

As mentioned earlier, there are two modes of operation in this embodiment of present invention. In the first mode of operation, the frequency re-timer 702 uses the count 904 of the period TO as the base line count that is continuously incremented and decremented to modulate the period (frequency) in a controlled fashion. The duty cycle is not adjusted or re-timed in this embodiment of the invention. The external control or feedback loop comprising 709, 710 and 711 in FIG. 7 and described previously adjusts the duty cycle to maintain regulation at the output. In the second mode of operation, both the count of the period TO 904 as well as the count of the duty cycle 903 are used. In this mode of operation, the duty cycle is also adjusted to maintain the same duty ratio at the output on per cycle-to-cycle basis. Note that for both modes of operation described above, in order to ensure loop stability, the rate at which the frequency is re-timed (frequency modulated) is lower (i.e. is slower) than the closed loop response time. However, if loop stability is not a concern, then the frequency modulation (retiming rate) may be higher than the closed loop response time.

From the description above, a number of advantages of the previous described embodiments become evident:

The reduction of radiated and/or conducted emissions (noise) is achieved by using the Quasi-Peak (QP) method of measurement. The QP emissions measurement method uses a weighted value over a given time interval (also known as the QP detector's decay time) to determine the strength of the radiated or conducted emissions. If the repetition interval (i.e. repetition rate of the noise pulses) of the emitted noise is longer than the QP detector's decay time, the QP reading for the noise signal is low. Conversely, if the repetition rate is faster than the decay time interval, the measured QP level is high. This invention maintains a constant frequency for a selected optimal dwell time (in relation to the QP detector's rise and decay times), then varies the frequency either discretely or in a constant manner, linearly or non-linearly, or randomly, at a selected optimal rate and over a selected optimal range of frequencies to help suppress conducted and/or radiated emission levels (electric and magnetic field strengths) below the maximum limits that are permitted using QP measurement methodologies. In this invention, the optimal period during which the frequency is kept constant is determined by taking into account both or either of the rise time and the decay time specified for the peak detector used for the measurement. The switching frequency being varied (or frequency discretely hopped) may or may not have spread spectrum modulation pre-imposed on it.

The reduction of radiated and/or conducted emissions (noise) may also be achieved by using the peak and average methods of radiated and conducted emissions measurements. By using the correct values of modulation depth δ, spread spectrum modulation helps to reduce the peak values of the emissions. This invention provides an additional level of emissions control and suppression by continuously varying the modulation depth δ between two, or any number of values, creating a weighted averaging effect on the peak values of the frequency components that are specifically targeted for control and/or reduction.

Further suppression of the peak values that is achieved, at frequencies that would otherwise exceed (fail) the emission limits with the application of the spread spectrum modulation technique alone, by using the weighted averaging (dynamic modulation) technique is another use of this invention.

The reduction of radiated and/or conducted emissions (noise) is achieved by re-timing the primary PWM frequency in a periodic manner by a device that is placed external to the main PWM controller block, while allowing the proper duty cycle that is required to regulate the external voltage, current or power or other derivatives of these quantities to be adjusted by the main current or voltage feedback loop.

As the PWM frequency is re-timed, corresponding changes in the duty cycle are allowed to occur. The frequency re-timer however, uses a feedback loop to adjust the PWM duty cycle to continuously adjust the duty cycle to the appropriate values necessary to maintain regulation of the output. This technique greatly simplifies the design of the frequency re-timer and reduces the overall size and cost of the implementation. The rate at which the frequency is re-timed, the amount of variation (frequency excursion) of the re-timed frequency and the path that the re-timed frequency traverses as a function of time can either be adjustable or pre-set (fixed).

The frequency re-timer performs the function of measuring the input frequency and the ON-time or duty cycle of the input waveform. It then retimes the input frequency in a desired periodic, non-periodic, quasi random or random manner. Thus, the output parameter of the system such as voltage, current, power, rpm, torque, light intensity or other physical or numerical representations of these parameters is varied from the original value.

Any sudden changes in the input PWM frequency is detected by the frequency re-timer by continuously counting the period and/or ON-time of the input PWM signal. This allows the frequency re-timer to adjust to sudden changes in the PWM signal for reasons such as power savings, system load adjustments and changes in operating mode.

The frequency re-timing method disclosed in this invention can be used to create frequency sidebands that may be filtered out via a frequency detector to control a plurality of system parameters including, but not limited to, power supply output voltage current, power as well as motor speed, power and torque, light intensity and other system parameters.

The invention described can be used in all systems using a periodic signal, such as Switched Mode Power Supplies, motor control, LED drivers, as well as in other synchronous clock and/or data applications such as systems that use high speed and digital data clocking.

The foregoing descriptions of embodiments of the present invention have been presented for purposes of illustration and description only. They are not intended to be exhaustive or to limit the present invention to the form disclosed. Accordingly, many modifications and variations will be apparent to practitioners skilled in the art. Additionally, the above disclosure is not intended to limit the present invention.

What is claimed is:

1. A method of modulating a frequency carrier signal for reducing radiated or conducted electromagnetic interference, comprising:
   receiving a clock signal from a clock generation circuit;
   generating a set of frequency modulation parameters associated with said frequency carrier signal;
   setting a repetition period and a sequence of programmable time durations, wherein the sum of said time durations equal to said repetition period;
   selecting one of said frequency modulation parameters to use in one of said programmable time durations, wherein the value of said selected frequency modulation parameter is kept within its corresponding time duration;
   applying said frequency modulation parameters to said frequency carrier signal to affect the output frequency of said frequency carrier signal; and
   using standard Quasi-Peak measurement method and detector as a way for the selection of said frequency modulation parameters and setting said time durations, wherein said repetition period is set to be substantially longer than the decay time of said Quasi-Peak detector.

2. The method of claim 1, wherein said frequency modulation parameters are frequency modulation depths and the values of said selected frequency modulation depths at said repetition period are periodic or non-periodic.

3. The method of claim 1, wherein said frequency modulation parameters are discrete frequencies and the values of said selected discrete frequencies at said repetition period are periodic or non-periodic.

4. The method of claim 3, further comprising using standard Quasi-Peak measurement method and detector as a way for the selection of said discrete frequencies, and the difference between any two consecutive ones of said discrete frequencies in sequence is substantially greater than the resolution bandwidth of said Quasi-Peak measurement method.

5. The method of claim 1, wherein said frequency modulation parameters include both frequency modulation depths and discrete frequencies, wherein the values of said selected frequency modulation depths and discrete frequencies at said repetition period are periodic or non-periodic.

6. The method of claim 1, wherein each of said programmable time durations is preferably set to be substantially shorter than the rise time of said Quasi-Peak detector.

7. An apparatus that modulates a frequency carrier signal for reducing radiated or conducted electromagnetic interference, comprising:
   a clock generation circuit configured to generate a clock signal;
   a frequency modulator, receiving said clock signal and generating a set of frequency modulation parameters associated with said frequency carrier signal;
   a dynamic timing selector, operatively connected to said frequency modulator, for setting a repetition period and a sequence of programmable time durations, wherein the sum of said time durations is equal to said repetition period; and
   a frequency modulation parameter selector, operatively connected to said frequency modulator, for selecting one of said frequency modulation parameters to use in one of said programmable time durations, wherein the value of said selected frequency modulation parameter is kept within its corresponding time duration;
   wherein said frequency modulator and dynamic timing selector are configured to use standard Quasi-Peak measurement method and detector as a way for the selection of said frequency modulation parameters and setting said time durations, said repetition period is set to be substantially longer than the decay time of said Quasi-Peak detector.

8. The apparatus of claim 7, wherein said frequency modulation parameters are frequency modulation depths and the values of said selected frequency modulation depths at said repetition period are periodic or non-periodic.

9. The apparatus of claim 7, wherein said frequency modulation parameters are discrete frequencies and the values of said selected discrete frequencies at said repetition period are periodic or non-periodic.

10. The apparatus of claim 9, wherein said frequency modulator and dynamic timing selector are configured to use standard Quasi-Peak measurement method and detector as a way for the selection of said discrete frequencies, and the difference between any two consecutive ones of said discrete frequencies in sequence is substantially greater than the resolution bandwidth of said Quasi-Peak measurement method.

11. The apparatus of claim 7, wherein said frequency modulation parameters include both frequency modulation depths and discrete frequencies, wherein the values of said selected frequency modulation depths and discrete frequencies at said repetition period are periodic or non-periodic.

12. The apparatus of claim 7, wherein each of said programmable time durations is preferably set to be substantially shorter than the rise time of said Quasi-Peak detector.

* * * * *